US010243323B2

(12) United States Patent
Caer et al.

(10) Patent No.: US 10,243,323 B2
(45) Date of Patent: Mar. 26, 2019

(54) METHOD OF FABRICATING A SILICON PHOTONIC CHIP WITH INTEGRATED ELECTRO-OPTICAL COMPONENT AND LENS ELEMENT

(71) Applicant: International Business Machines Corporation, Armonk, NY (US)

(72) Inventors: Charles Jean Ghislain Caer, Adliswil (CH); Antonio La Porta, Kilchberg (CH); Bert J. Offrein, Schoenenberg (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/701,623

(22) Filed: Sep. 12, 2017

(65) Prior Publication Data
US 2018/0013262 A1    Jan. 11, 2018

Related U.S. Application Data

(62) Division of application No. 14/944,301, filed on Nov. 18, 2015, now Pat. No. 9,793,682.

(51) Int. Cl.
*H01S 5/026* (2006.01)
*G02B 6/13* (2006.01)
(Continued)

(52) U.S. Cl.
CPC .............. *H01S 5/0261* (2013.01); *G02B 6/13* (2013.01); *G02B 6/4214* (2013.01); *H01S 5/026* (2013.01);
(Continued)

(58) Field of Classification Search
CPC ........ G02B 6/13; G02B 6/4214; H01S 5/0261
See application file for complete search history.

(56) References Cited

U.S. PATENT DOCUMENTS

| 9,778,493 | B1 * | 10/2017 | Krishnamoorthy | ..... G02F 1/011 |
| 2011/0278441 | A1 * | 11/2011 | Vermeulen | ............. G02B 6/124 |
| | | | | 250/227.23 |

(Continued)

OTHER PUBLICATIONS

List of IBM Patents or Patent Applications Treated as Related, U.S. Appl. No. 15/701,623, filed Sep. 12, 2017, 2 Pages.

*Primary Examiner* — Akm E Ullah
(74) *Attorney, Agent, or Firm* — Cantor Colburn LLP; Daniel Morris

(57) ABSTRACT

Embodiments include a silicon photonic chip having a substrate, an optical waveguide on a surface of the substrate and a cavity. The cavity includes an electro-optical component, configured for emitting light perpendicular to said surface and a lens element arranged on top of the electro-optical component. The lens is configured for collimating light emitted by the electro-optical component. The chip also includes a deflector arranged on top of the lens element and configured for deflecting light collimated through the latter toward the optical waveguide. The lens element includes electrical conductors connected to the electro-optical component. The electrical conductors of the lens element may for instance include one or more through vias, one or more bottom electrical lines on a bottom side of the lens element (facing the electro-optical component), and at least one top electrical line.

20 Claims, 4 Drawing Sheets

(51) Int. Cl.
*G02B 6/42* (2006.01)
*H01S 5/30* (2006.01)
*H01S 5/183* (2006.01)
*H01S 5/022* (2006.01)

(52) U.S. Cl.
CPC ........ *H01S 5/0267* (2013.01); *H01S 5/02248* (2013.01); *H01S 5/183* (2013.01); *H01S 5/3013* (2013.01)

(56) References Cited

U.S. PATENT DOCUMENTS

| | | | |
|---|---|---|---|
| 2013/0182998 A1* | 7/2013 | Andry | G02B 6/4204 385/33 |
| 2014/0029888 A1* | 1/2014 | La Porta | H05K 13/00 385/2 |
| 2017/0141533 A1 | 5/2017 | Caer et al. | |

* cited by examiner

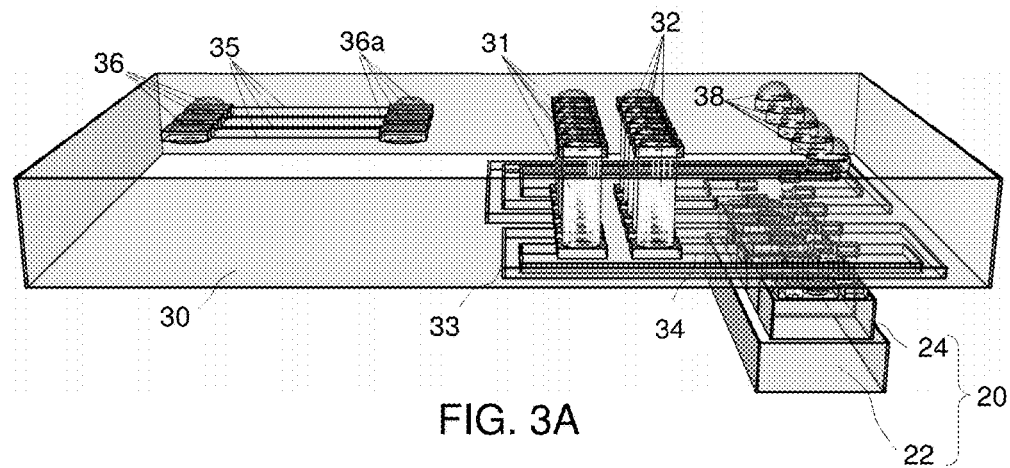
FIG. 3A
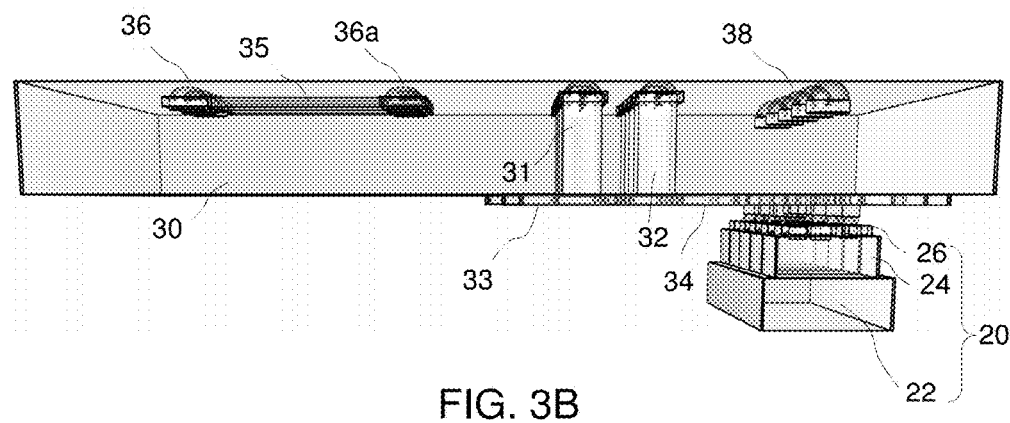
FIG. 3B
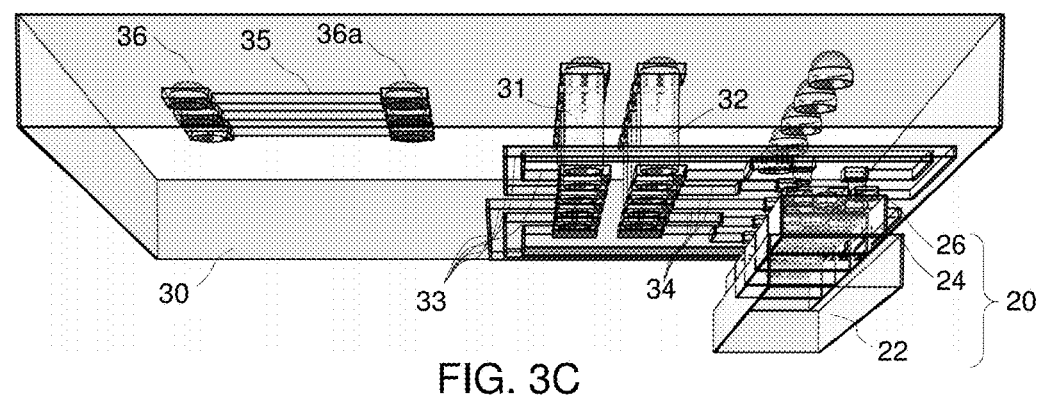
FIG. 3C
FIG. 3

US 10,243,323 B2

METHOD OF FABRICATING A SILICON PHOTONIC CHIP WITH INTEGRATED ELECTRO-OPTICAL COMPONENT AND LENS ELEMENT

DOMESTIC AND/OR FOREIGN PRIORITY

This application is a divisional of U.S. application Ser. No. 14/944,301, titled "SILICON PHOTONIC CHIP WITH INTEGRATED ELECTRO-OPTICAL COMPONENT AND LENS ELEMENT" filed Nov. 18, 2015, the entire contents of which are incorporated herein by reference.

BACKGROUND

The invention relates in general to the field of silicon photonic chips, and in particular to the integration of components, e.g., electro-, electro-optical and optical components, in such chips.

The integration of active components in a silicon photonics platform poses several technical problems. Of particular interest is the integration of laser sources made of III-V materials, as the latter are needed for various applications. A specific type of III-V lasers (known as VCSEL) is particularly attractive for telecommunications due to its performances, its small footprint and its mature technology. A key issue is to heterogeneously integrate components such as described above into a silicon photonic chip.

SUMMARY

According to a first aspect, the present invention is embodied as a silicon photonic chip, comprising: a substrate; an optical waveguide on a surface of the substrate; and a cavity. The cavity includes an electro-optical component, configured for emitting light perpendicular to said surface; and a lens element arranged on top of the electro-optical component and configured for collimating light emitted by the latter. The chip further includes a deflector arranged on top of the lens element and configured for deflecting light collimated through the latter toward the optical waveguide. The lens element includes electrical conductors connected to the electro-optical component.

In embodiments, the electrical conductors of the lens element include one or more through vias, one or more bottom electrical lines on a bottom side of the lens element (facing the electro-optical component), and at least one top electrical line.

According to another aspect, the invention is embodied as a method of fabrication of a silicon photonic chip such as disclosed herein. The method first includes providing the substrate, the latter having the optical waveguide on a surface thereof and further exhibiting said cavity therein. The lens element includes the electrical conductors and the deflector. The method further includes coupling the lens element to the electro-optical component, so as: to connect electrical conductors of the lens element to terminals of the electro-optical component; and to allow the lens element to collimate light emitted by the electro-optical component, in operation. Finally, the coupled lens element and electro-optical component is positioned in the cavity and the deflector is arranged on top of the lens element, so as for the deflector to deflect light collimated through the lens element toward the optical waveguide, in operation.

Devices and related fabrication methods embodying the present invention will now be described, by way of non-limiting examples, and in reference to the accompanying drawings.

BRIEF DESCRIPTION OF THE DRAWINGS

FIGS. 3A, 3B and 3C shows various three dimensional views of a lens element coupled to an electro-optical component, as involved in embodiments;

Figure 1:
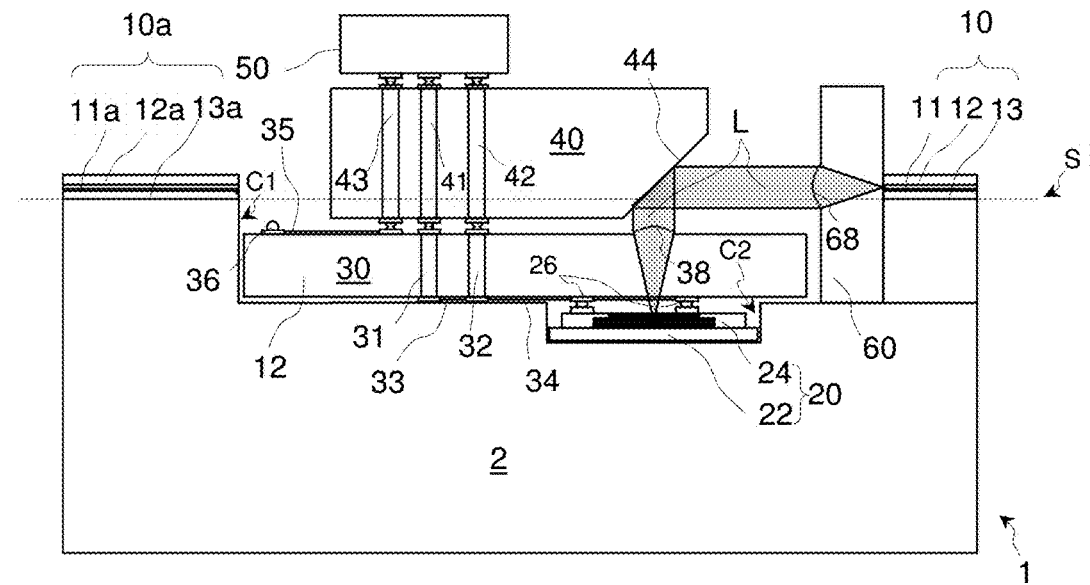
FIG. 1 is a cross-sectional view of a silicon photonics chip, according to embodiments.

The accompanying drawings show simplified representations of devices or parts thereof, as involved in embodiments. Technical features depicted in the drawings are not necessarily to scale. Similar or functionally similar elements in the figures have been allocated the same numeral references, unless otherwise indicated.

DETAILED DESCRIPTION

The present invention relates to silicon photonics chips, designs thereof, and fabrication methods for facilitating the integration and the connection of active (electro-optical) devices into integrated photonic circuits. The integration of active components in a silicon photonics platform poses several technical problems, a key issue being to heterogeneously integrate such components on a photonics chip, e.g., a silicon-on-insulator chip. One difficulty, in particular, resides in the coupling to optical waveguides, in particular if orthogonality in the light path is desired.

In reference to FIGS. 1-5, an aspect of the invention is first described, which concerns a silicon photonic chip 1, 1a. The chip basically comprises a substrate 2, i.e., a support which essentially determines mechanical properties (including stability) of the chip. The substrate 2 may for instance have a layered semiconductor-insulator-semiconductor structure, e.g., a silicon-insulator-silicon structure, and is preferably a silicon-on-insulator (SOI) wafer.

The silicon photonic chip 1, 1a further comprises one or more optical waveguides 10, 10a on a (top) surface S of the substrate 2. Optical waveguides 10, 10a may for instance comprise silicon waveguide cores 11, 11a patterned on top of a lower cladding layer 13, 13a, acting as part of a cladding for the cores 11, 11a. A cladding layer 12 may otherwise be structured on top of the cores 11, 11a, the latter patterned in a dedicated layer 111 (see FIG. 4). Layers 12, 13 (top and lower cladding layers) are preferably obtained as buried silicon dioxide layers, i.e., which are part of the SOI structure where a SOI wafer 2 is used.

The substrate 2 is otherwise structured so as to exhibit a cavity C1, adjacent the waveguides 10, 10a. For example, as seen in the embodiments of FIGS. 1, 2, 4 and 5, a first cavity C1 may itself be structured so as to exhibit a second (smaller) cavity C2 therein, such as for a component 30 to be housed in the cavity C1, on top of another component 20 housed in the second cavity C2. Cavities are preferably deep etched cavities, with the second cavity C2 etched in the first cavity C1. The dimensions of the cavities shall preferably be designed to match dimensions of components to be housed therein, for compactness. For instance, the height of cavity C2 may essentially correspond to a maximal height of component 20. In addition, components 20, 30 shall preferably closely fit, laterally (parallel to surface S) into their respective cavities C2, C1.

Figure 2:
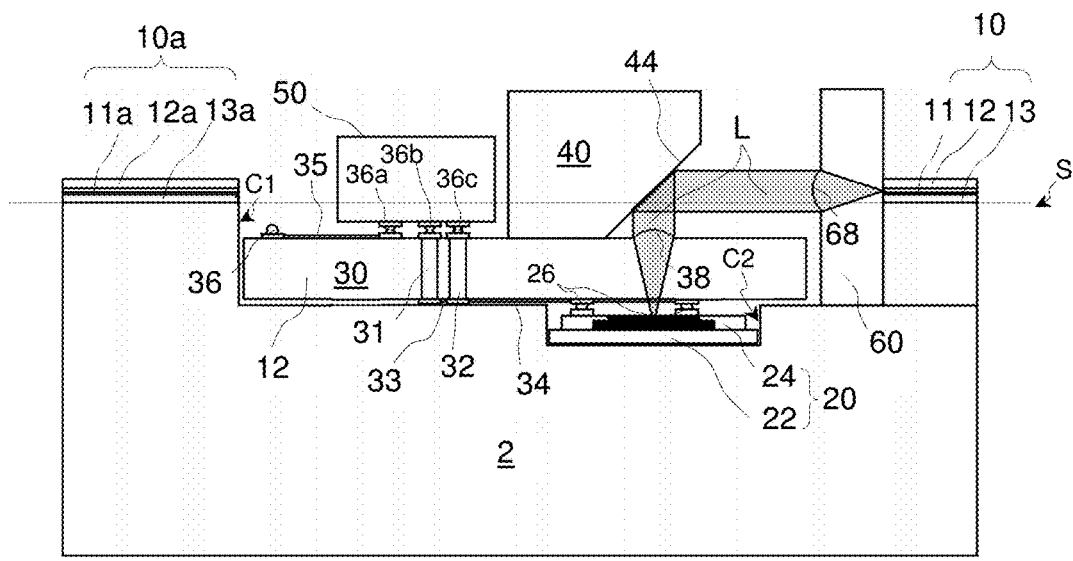
FIG. 2 is a cross-sectional view of a variant to the device of FIG. 1, where drivers are mounted on the lens array, instead of being mounted on top of the deflector, according to embodiments.

The cavity C1 notably comprises an electro-optical component 20. The latter is configured to emit light L perpendicular to the surface S, on which the waveguides 10, 10a are arranged. The component 20 is, however, preferably arranged to fit into a smaller cavity C2 provided in the larger cavity C1, as depicted in FIGS. 1-2.

The cavity C1 further comprises a lens element 30. The lens element may for instance laterally fit into the cavity C1, the latter dimensioned accordingly. The lens element is arranged on top of the electro-optical component 20, the latter preferably fitting into the smaller cavity C2. The lens element 30 is generally designed for collimating light L emitted by the element 20, in operation. The lens element 30 may essentially comprise silicon.

The chip 1, 1a further comprises a deflector 40, e.g., at least partly arranged (i.e., buried) in the cavity C1, for compactness. The deflector is arranged on top of the lens element 30. The deflector is configured for deflecting light L collimated through the lens element 30 toward the optical waveguide 10, in operation, so as to achieve an orthogonal light coupling, as best seen in FIGS. 1-2. The deflector 40 may essentially comprise silicon.

The lens element 30 comprises electrical conductors 31-35, integrated therewith, which connect to the electro-optical component 20. As it can be realized, electrical conductors 31-35 integrated in the lens element 30 can be fabricated beforehand, i.e., before assembling the lens element 30 with the active component 20 and placing the resulting assembly 20, 30 in the cavity C1. Thus, integrating electrical conductors 31-35 beforehand in the lens element 30 allows to simplify the fabrication process and further allows smaller footprints to be obtained for the chip 1, 1a, as discussed below.

The above arrangement makes it possible to couple light L emitted from the active component 20, e.g., a laser such as a vertical cavity surface emitting laser, or VCSEL, perpendicularly to the surface S, into the horizontal optical waveguide(s) 10. To that aim, the lens element 30 used has electrical conductors 31-35 already provided thereon and/or therein, e.g., integrated therewith, which allows more compact arrangements to be obtained.

Indeed, as such electrical conductors 31-35 need not be fabricated externally, that is, outside the lens element 30, the lateral footprint can be lowered (and the fabrication facilitated). Both the active component 20 and the lens element 30 can be buried in the cavity C1 (or, preferably in respective cavities C1, C2) while power can be provided from the top, via the electrical conductors 31-35 of the lens element 30, to the active component 20, without requiring additional, external (e.g., lateral) conductors. Electrical conductors are fabricated in and/or on the lens element 30 before assembling the various components 20, 30, 40, etc., instead of being fabricated afterwards. Thus, the various components 20, 30, 40, . . . can be fabricated independently and assembled afterwards, as explained later in more details in reference to FIGS. 6A, 6B, 6C, 6D and 6-F.

Figure 4:
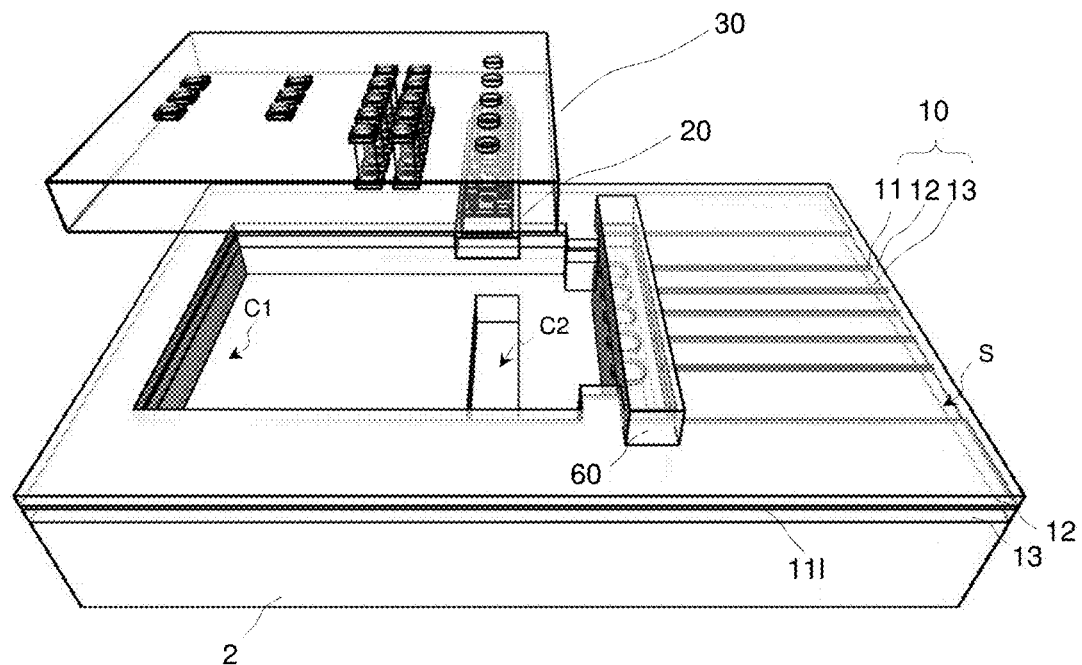
FIG. 4 and FIG. 5 show exploded three dimensional views of a silicon photonics chip at various stages of fabrication, according to embodiments.
Figure 5:
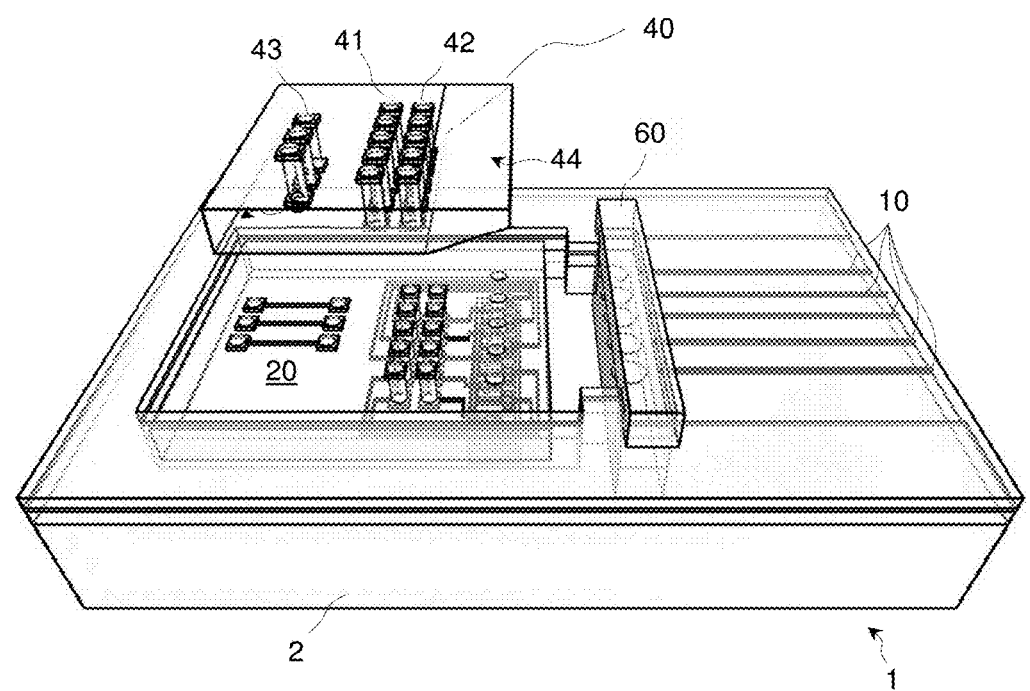
Figure 6A:
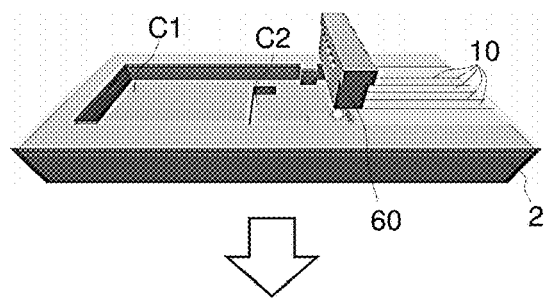
FIGS. 6A, 6B, 6C, 6D, 6E and 6F illustrate a method of fabrication of a variant to the device of FIG. 1, according to embodiments.
Figure 6B:
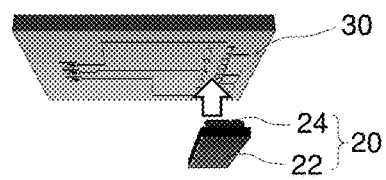
Figure 6C:
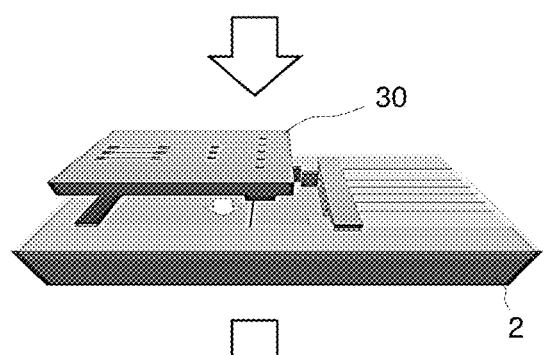
Figure 6D:
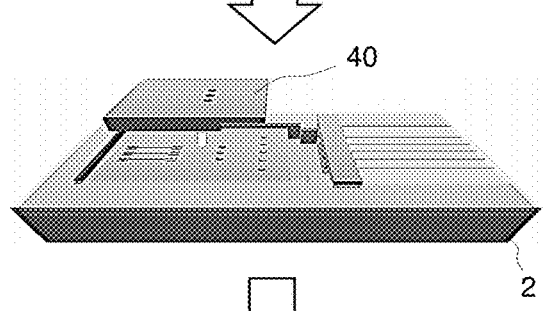
Figure 6E:
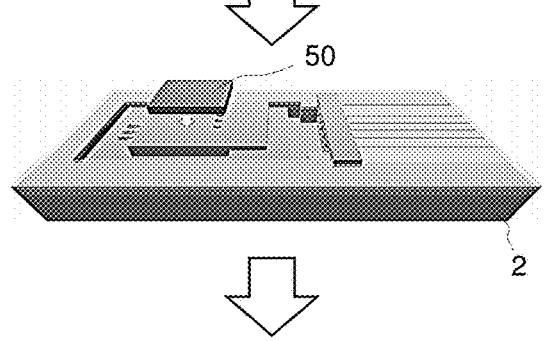
Figure 6F:
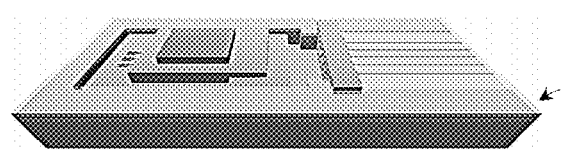

In typical embodiments, the chip 1, 1a comprises an array of optical waveguides 10 and an array electro-optical components 20, as better seen in FIGS. 3-5. Each of the electro-optical components 20 is configured for emitting light L perpendicular to said surface S. In addition, the chip may comprise a lens array 30 comprising several lenses 38, where the lens array is arranged on top of the array of electro-optical components 20. Each of the lenses 38 is positioned and otherwise configured for collimating light L emitted by an opposite one of the electro-optical components 20. The deflector 40 is arranged on top of the lens array and may be at least partly arranged (i.e., buried) in the cavity C1, for compactness. The deflector is otherwise configured for deflecting light L collimated through each of the lenses 38 toward a respective one of the optical waveguides 10, in operation of the device 1, 1a. The deflector 40 is a 90° deflector and preferably comprises a unique 45° angle mirror 44 (see FIGS. 1, 2 and especially FIG. 5), for simplicity. In variants, several mirrors may be provided, each arranged so as to deflect light collimated through a respective one of the lenses 38 toward a respective one of the optical waveguides 10. Note that silicon-based 45° micro-reflector can be achieved as discussed, e.g., in Optics Express 17 (23), 20939 (2009), where a mirror is fabricated by etching silicon with a mixture of KOH and isopropyl alcohol to control the etching angle.

Note, however, that a single active component 20 may be needed, together with a single lens 38 and a single coupled waveguide 10, instead of arrays. The following description refers to an active component 20 and a lens element 30, without prejudice as to the number of light sources 20 and lenses 38, for the sake of generality.

The electrical conductors 31-35 of the lens element 30 may for instance comprise one or more through vias 31, 32. The vias are typically metallized vias. Each of the vias 31, 32 may be connected to the electro-optical component 20 via suitable conductors (e.g., wire bonding 33, 34) and pads 26, as illustrated in FIGS. 3A-3B. Power can accordingly be provided from the top of the lens element 30, through the vias 31, 32 provided therein, without requiring additional external (lateral) conductors, which would need to be fabricated after assembly of the components 20, 30 into the support 2.

In embodiments, the electrical conductors 31-35 further comprise one or more bottom electrical lines 33, 34, e.g., to enable wire bonding to the active component 20. The bottom electrical lines 33, 34 are provided on a bottom side of the lens element 30, which bottom side faces the electro-optical component 20, once coupled to the element 30. The vias 31, 32 are connected to the electro-optical component 20 through the bottom electrical lines 33, 34. The electrical conductors 33, 34 typically contacts electrical terminals 26 provided on the active element 20, thereby enabling power supply to the active element 30, as illustrated in FIGS. 1, 2 and 3B. By "terminals", it is meant any suitable type of pads or metal bumps 26 enabling electrical contact.

The electrical lines 33, 34 allows the vias 31, 32 to be off-centered with respect to electrical connectors of the active components. All the more, providing electrical lines 33, 34 directly on the lens element allows to save post-assembly fabrication steps, as noted earlier.

In embodiments, the electrical conductors 31-35 further comprise one or more top electrical lines 35 and, correspondingly, one or more electrical pads (i.e., bumps, etc.) 36, 36a. The pads are connected to, e.g., positioned at an end of, a respective one of the top lines 35. The top electrical lines 35 and the electrical pads 36 are located on a top side of the lens element 30, opposite to the bottom side. The top side of the lens element faces a face of the deflector 40. Such an arrangement enables external power supply from the electrical pads 36, from the top of the lens element 30. This, in turn, allows a more compact arrangement (with a reduced lateral footprint) as no additional lines need be fabricated laterally, i.e., beside the lens element 30, to achieve the same. Note, however, that the top lines 35 can be skipped, in variants, if power is supplied to the drivers 50, which are discussed later in detail.

As seen in FIGS. 1, 2, 4 and 5, the silicon photonic chip may further comprises a second lens element 60, suitably configured for focusing light L deflected by the deflector 40 into the optical waveguides 10, if needed. The lens element 30 is accordingly referred to as a "first" lens element in the following. An optical adapter 60 such as disclosed in U.S. Patent Publication No. 2014/0093207 may be used to that aim.

As said earlier, the electro-optical component 20 may preferably comprise a laser, and, in particular, a VCSEL. Preferably, an array of VCSELs 20 is relied upon, as illustrated in FIG. 3. Using VCSELs is particularly advantageous for telecommunication applications, due to their performances and small footprints. Thus, VCSEL drivers may be needed. As seen in FIGS. 1, 2 (and also in FIGS. 6E and 6F), VCSEL drivers 50 may be provided above the lens element 30. VCSEL drivers 50 can be connected to the VCSELs 20 via one or more of the electrical conductors 31-35, as explained below in detail.

Referring now specifically to FIG. 1, the chip 1 may comprise VCSEL drivers 50 provided on top of the deflector 40, above the lens element 30. The deflector 40 may, in that case, comprise additional electrical conductors 41-43, so as to connect the VCSEL drivers 50 to the electrical conductors 31-34 of the lens element 30. In particular, the additional conductors 41-43 may comprise through vias 41-43, to reduce the lateral footprint of the device 1.

In the embodiment of FIG. 1, power can be externally supplied from the pad-conductor arrangement 36-35-36a (see also FIGS. 3-5). Electrical current reaches the drivers 50 through the vertical vias 43. The drivers 50 are otherwise connected to the vias 31, 32 of the lens element 30 through the vias 41, 42, see also FIG. 5.

The devices shown in FIGS. 1, 3-5 assume a same wiring scheme. They involve arrays of five VCSELs, and consistently five lenses 38 and five coupled waveguides 10.

Concerning now the wiring schemes depicted of FIGS. 1, 3-5: different embodiments can be contemplated (a thing that will impact the minimal number of vias needed), depending on whether independent modulation of the VCSELs is desired or not. In simple cases, the VCSELs are driven by a static voltage bias for continuous wave lasing. E.g., modulation can be performed in the silicon waveguides to that aim. In such cases, two vias 43 may be used for the driver to get power supply (as in preferred embodiments). Then, two more vias 41, 42 may be provided to connect the driver chip to the VCSELs through the lens component and the deflector (as depicted in FIG. 1), which are connected together by the metal lines 33, 34. In variants, the VCSELs may be independently biased (with static bias) by the driver chip containing multiple channels. In more complex cases, the VCSELs are independently driven at high speed with a non-return to zero bias (i.e., a variable voltage bias and a static voltage bias are involved). In such cases, more vias are needed for signal processing (depending on the architecture of the driver chip). I.e., two vias per VCSEL are needed for connecting to the driver chip.

The chip 1a depicted in FIG. 2 differs from the chip of FIG. 1 in that the drivers 50 are mounted directly on (a top surface of) the lens element 30, next to the deflector 40. In that case, there is no need to provide through vias in the deflector. The design of the chip 1a allows for smaller vertical dimensions, whereas the design of the chip 1 of FIG. 1 allows the lateral footprint to be reduced. In the embodiment of FIG. 2, power is externally supplied from the pad-conductor arrangement 36-35. Electrical current reaches the drivers 50 through terminals (or pads) 36a. The drivers 50 are otherwise connected to the vias 31, 32 through terminals (or pads) 36b, 36c. The terminals (or pads) 36a-36c are directly on the drivers 50. The wiring scheme on the bottom surface of the lens element 30 can otherwise be similar to that of FIGS. 1, 3-5.

Finally, the silicon photonic chips 1, 1a may further comprise a filling material. I.e., the cavity C1 may be at least partly filled with a material so as to fix the electro-optical component 20, the lens element 30 and the deflector 40 therein. The vacant space left in the cavities shall typically be filled with an underfill, e.g., a material cured so as to secure the components 20-40.

Referring now to FIGS. 6A, 6B, 6C, 6D and 6-F: according to another aspect, the invention can be embodied as a method of fabrication of a silicon photonic chip such as described above. This method takes advantage of the design of the components 20-40 and the substrate 2, in particular of the electrical conductors integrated in/on the lens element 20, whereby the components 20-40 can be simply assembled in the substrate 2. The method basically revolves around the following steps:

First, elements 2, 20-40 are provided. Namely, a structured substrate 2, FIG. 5A, having optical waveguides 10 already fabricated (using standing waveguide fabrication techniques) on a surface S thereof and further exhibiting one or more cavities C1, C2 therein; the electro-optical component 20, with electrical conductors 31-35 already integrated therewith, FIG. 5B; the lens element 30, FIG. 5B, the latter already comprising said electrical conductors 31-35; and the deflector 40, FIG. 5D.

The lens element 30 is coupled to the electro-optical component 20, FIG. 5B, so as to: connect electrical conductors 33, 34 of the lens element to terminals 26, FIG. 3B of the electro-optical component 20; and to later allow the lens element 30 to collimate light L emitted by the electro-optical component 20, when operating the device 1, 1a, as explained earlier in reference to FIGS. 1-5. Note that the wiring scheme of the elements 20-30 assumed in FIGS. 6A, 6B, 6C, 6D and 6F differ from the schemes assumed so far in FIGS. 1-5.

The coupled lens element 30 and electro-optical component 20 are positioned in the cavity, FIG. 5C, e.g., such as for the active component 20 to fit in to the smaller cavity C2, as explained earlier. Next, the deflector 40 is arranged on top of the lens element 30, so as for the deflector to deflect light L collimated through the lens element 30 toward the optical waveguides 10, in operation.

The electro-optical component 20 is preferably a VCSEL array and the lens element 30 a lens array 30. The coupling of the lens array 30 to the VCSEL array 20 may notably be achieved by flip-chip bonding of a VCSEL array to the bottom surface (i.e., backside) of the lens array 30. A second lens element 60 may be inserted in the substrate 2, FIG. 5A, prior to coupling the lens element 30 to the active element 20, if needed.

Consistently with the embodiment of FIG. 1, the present fabrication methods may further comprise arranging (FIG. 5E) drivers 50 for the electro-optical component 20 on top of the deflector 40, so as for the driver 50 to connect to electrical conductors 31-34 of the lens element 30, via additional electrical conductors 41-43 of the deflector 40. In variants, each of the deflector 40 and the VCSEL driver 50 may be mounted on the lens element 30, as described earlier in reference to FIG. 2. A filler material may be inserted and cured, to secure (at least part of) the components 20-50.

The above embodiments have been succinctly described in reference to the accompanying drawings and may accommodate a number of variants. Several combinations of the above features may be contemplated. Examples are discussed now.

In particularly preferred embodiments, the chip comprises a VCSEL array such as depicted in FIG. 3, mounted in a cavity C2 in a III-V semiconductor substrate, i.e., an SOI substrate comprising optical waveguides and patterned with deep etched cavities used as landing pads for the optical component 30 and the VCSEL array 20, while altogether providing heat sink. The lens array 38 is patterned on the top side of a high refractive index material 30 for collimating light from the VCSELs 20. Metallized through vias 31, 32 and electrical lines 33, 34 on the backside allow electrical contact with the VCSEL metal pads 26. A 90° deflector 40 is used, which is essentially made of silicon and comprises a single 45° angle mirror. The deflector further comprises alignment features and metallized through vias allowing electrical contact with metal bumps on the lens array 30 on the backside and the VCSEL drivers 50 from the topside. A second lens array 60 (in silicon too) is provided for focusing light into the silicon waveguides 10. A cured material fills the residual space to glue all elements.

Regarding now the fabrication process, each element is fabricated independently and the final assembly is done step-by-step. Passive alignment can be used. The integration of VCSELs and their drivers directly on a silicon photonics chip is scalable; compact packagings are obtained. Namely, the VCSEL array 20 is directly embedded in the silicon photonics chip with other optical components as follows. The lens array is mounted on the VCSEL array and mediates both electrical and optical signals. Electrical vias allow electrical access from the topside. The deflector is directly bonded on the lens and electrical vias ensure the electrical drive and the power supply. Flip-chip bonding of the optical components and use of appropriate mechanical features (if necessary, mechanical features patterned on the lens element and possibly the VCSEL array too can be used) will ensure an accurate positioning with respect to the size of the expanded beam waist. The different components are scalable and can be processed on a wafer-scale.

Light is emitted in the vertical plane and is coupled to devices 10 in an orthogonal plane. Using lens elements 30, 60 and a deflector 40 as discussed above allows to handle mode profiles at the VCSEL that are bigger than the mode confined in the waveguides. Efficiently coupling of light from the VCSEL to silicon waveguides can be achieved. Amongst other advantages, present designs of devices offer the following advantages: they offer a tolerant alignment, compact packagings, they are compatible with high-speed electronics and the head sink structure 2 ensures thermal stability of the VCSELs.

The method as described above can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip can then be integrated with other chips, discrete circuit elements, and/or other signal processing devices as part of either (a) an intermediate product, such as a motherboard, or (b) an end product. The end product can be any product that includes integrated circuit chips, ranging from low-end applications to advanced computer products.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated.

What is claimed is:

1. A method of fabrication of a silicon photonic chip, the method comprising:
providing a substrate, the substrate having an optical waveguide on a surface thereof and further exhibiting a cavity therein;
providing an electro-optical component, a lens element comprising electrical conductors, and a deflector;
coupling the lens element to the electro-optical component, so as:
to connect the electrical conductors of the lens element to terminals of the electro-optical component; and
to allow the lens element to collimate light emitted by the electro-optical component, in operation;
positioning the coupled lens element and electro-optical component in the cavity; and
arranging the deflector on top of the lens element, so as for the deflector to deflect light collimated through the lens element toward the optical waveguide, in operation.

2. The method of fabrication of claim 1, wherein the electro-optical component is configured for emitting light perpendicular to the surface of the substrate.

3. The method of fabrication of claim 1, further comprising arranging a driver for the electro-optical component on top of the deflector, so as for the driver to connect to one or more of the electrical conductors via one or more additional electrical conductors of the deflector.

4. The method of fabrication of claim 1, further comprising arranging a driver for the electro-optical component on the lens element, so as for the driver to connect to one or more of the electrical conductors.

5. The method of fabrication of claim 1, wherein the deflector is at least partly arranged in the cavity.

6. The method of fabrication of claim 5, wherein the deflector is a 90° deflector.

7. The method of fabrication of claim 1, wherein the electro-optical component comprises a laser.

8. The method of fabrication of claim 7, wherein the electro-optical component comprises a vertical cavity surface emitting laser, or VCSEL.

9. The method of fabrication of claim 8, further comprising a VCSEL driver on top of the lens element, the VCSEL driver connected to the VCSEL via one or more of said electrical conductors.

10. The method of fabrication of claim 9, wherein said electrical conductors of the lens element are first electrical conductors and the deflector comprises second electrical conductors, and wherein the VCSEL driver is arranged on top of the deflector, the VCSEL driver connected to one or more of said first electrical conductors via one or more of said second electrical conductors.

11. A method of fabrication of a silicon photonic chip, the method comprising:
providing a substrate, the substrate having an optical waveguide on a surface thereof and further exhibiting a cavity therein;
providing an electro-optical component configured for emitting light perpendicular to the surface of the substrate;
providing a lens element arranged on top of the electro-optical component and configured for collimating light emitted by the electro-optical component, the lens element comprising electrical conductors connected to terminals of the electro-optical component;
positioning the coupled lens element and electro-optical component in the cavity; and
arranging a deflector on top of the lens element, so as for the deflector to deflect light collimated through the lens element toward the optical waveguide, in operation.

12. The method of fabrication of claim 11, the method further comprising arranging a driver for the electro-optical component on top of the deflector, so as for the driver to connect to one or more of said electrical conductors via one or more additional electrical conductors of the deflector.

13. The method of fabrication of claim 11, the method further comprising arranging a driver for the electro-optical component on the lens element, so as for the driver to connect to one or more of said electrical conductors.

14. The method of fabrication of claim 11, wherein the deflector is at least partly arranged in the cavity.

15. The method of fabrication of claim 14, wherein the deflector is a 90° deflector.

16. The method of fabrication of claim 11, wherein the electro-optical component comprises a laser.

17. The method of fabrication of claim 16, wherein the electro-optical component comprises a vertical cavity surface emitting laser, or VCSEL.

18. The method of fabrication of claim 17, further comprising a VCSEL driver on top of the lens element, the VCSEL driver connected to the VCSEL via one or more of said electrical conductors.

19. The method of fabrication of claim 18, wherein said electrical conductors of the lens element are first electrical conductors and the deflector comprises second electrical conductors, and wherein the VCSEL driver is arranged on top of the deflector, the VCSEL driver connected to one or more of said first electrical conductors via one or more of said second electrical conductors.

20. The method of fabrication of claim 18, further comprising mounting each of the deflector and the VCSEL driver on the lens element.

\* \* \* \* \*